United States Patent [19]

Torii et al.

[11] Patent Number: 5,755,888
[45] Date of Patent: May 26, 1998

[54] METHOD AND APPARATUS OF FORMING THIN FILMS

[75] Inventors: Hideo Torii; Eiji Fujii, both of Osaka; Shigenori Hayashi, Nara; Ryoichi Takayama, Osaka, all of Japan

[73] Assignee: Matsushita Electric Industrial Co., Ltd., Osaka, Japan

[21] Appl. No.: 518,267

[22] Filed: Aug. 23, 1995

[30] Foreign Application Priority Data

Sep. 1, 1994 [JP] Japan .................... 6-208427

[51] Int. Cl.[6] .................... C23C 16/00; C23C 14/00
[52] U.S. Cl. .................... 118/719; 118/715; 118/723 E; 118/50.1; 204/298.07; 204/298.25
[58] Field of Search .................... 118/719, 715, 118/723 E, 50.1; 204/298.07, 298.25, 298.33, 298.35

[56] References Cited

U.S. PATENT DOCUMENTS

| | | | |
|---|---|---|---|
| 4,477,311 | 10/1984 | Mimura | 156/643 |
| 4,725,204 | 2/1988 | Powell | 417/205 |
| 4,951,601 | 8/1990 | Maydan | 118/719 |
| 5,043,299 | 8/1991 | Chang et al. | 437/192 |
| 5,076,205 | 12/1991 | Vowles | 118/719 |
| 5,139,459 | 8/1992 | Takahashi | 454/187 |
| 5,216,223 | 6/1993 | Straemke | 219/121.43 |
| 5,285,097 | 2/1994 | Hirai | 257/417 |
| 5,288,329 | 2/1994 | Nakamura | 118/729 |
| 5,288,379 | 2/1994 | Namiki | 204/192.12 |
| 5,292,393 | 3/1994 | Maydan | 156/345 |
| 5,303,671 | 4/1994 | Kondo | 118/719 |
| 5,324,360 | 6/1994 | Kozuka | 118/719 |
| 5,330,633 | 7/1994 | Matsumoto | 204/298.25 |
| 5,344,542 | 9/1994 | Maher | 204/298.15 |
| 5,364,219 | 11/1994 | Takahashi | 414/217 |
| 5,378,283 | 1/1995 | Ushikawa | 118/719 |
| 5,388,944 | 2/1995 | Takanabe | 414/217 |
| 5,433,785 | 7/1995 | Saito | 118/719 |
| 5,514,260 | 5/1996 | Seo | 204/298.25 |

FOREIGN PATENT DOCUMENTS

| | | | |
|---|---|---|---|
| 149476 | 7/1986 | Japan | 204/298.25 |
| 5-109655 | 4/1993 | Japan | |
| WO 89/12702 | 12/1989 | WIPO | |
| WO 90/09466 | 8/1990 | WIPO | |

OTHER PUBLICATIONS

JP-A-63 274765, *Patent Abstracts of Japan,* vol. 13, No. 095, Mar. 6, 1989.
Copy of European Search Report dated Dec. 21, 1995, Application No. 95113430.3.

*Primary Examiner*—Richard Bueker
*Assistant Examiner*—Jeffrie R. Lund
*Attorney, Agent, or Firm*—Merchant, Gould, Smith, Edell, Welter & Schmidt, P.A.

[57] ABSTRACT

An apparatus of forming thin films, which is small and requires a short thin-film formation time, is provided which comprises at least one physical vapor deposition device and at least one chemical vapor deposition device, wherein said physical vapor deposition device and said chemical vapor deposition device are provided with an exhaust pipe respectively for connection with a common exhaust means and an exhaust switching means. A method of forming thin films using this apparatus is also provided. According to the configuration in which the exhaust switching means is connected via exhaust pipes to the physical vapor deposition device, to the chemical vapor deposition device, and to the exhaust means, this apparatus can be accomplished in a small size which has at least two chambers and one exhaust means. In this way, thin films can be formed in a short thin-film formation time with a small apparatus, since vapor of a starting material which is led in at the time of chemical vapor deposition does not enter the physical vapor deposition device.

6 Claims, 6 Drawing Sheets

METHOD AND APPARATUS OF FORMING THIN FILMS

FIELD OF THE INVENTION

This invention relates to a method and an apparatus of forming thin films, which is characterized by connecting a physical vapor deposition device and a chemical vapor deposition device, which is small and requires a short thin-film formation time.

BACKGROUND OF THE INVENTION

Recently, the technique has been eagerly developed to process various materials of conductor, semiconductor, dielectrics, magnetic body, and superconductor into thin films to be used to manufacture thin film devices. Large numbers of apparatus for forming a thin film have been developed according to the objective. Among them, there is an apparatus of forming thin films which can perform a physical vapor deposition and a chemical vapor deposition in the same chamber (e.g., Laid-open Japanese Patent Application No. (Tokkai Hei) 5-109655). We manufactured a thin-film formation apparatus with the same principle shown in FIG. 5. This apparatus is configured such that an electrode integrated with a substrate heater 51 and an electrode 52 are disposed inside a reaction chamber 50, and the electrode 52 is connected to a high-frequency generator (rf (radio-frequency) generator) 53. Also, a substrate 54 is placed on the electrode integrated with a substrate heater 51, and the substrate heater integrated electrode 51 is rotated during the film formation by a substrate rotary system 55. 56 represents an exhaust system for enhancing a vacuum degree inside the reaction chamber 50. 57 represents a pipe for letting in vapor which arised by vaporizing a starting material through heating during the chemical vapor deposition. When a thin film capacitor comprising one kind of thin film device shown in FIG. 6 is manufactured using this thin-film formation apparatus, argon gas (throughput 2 SCCM) comprising an inactive gas is first let in from the pipe 57 for sputtering. Furthermore, on the upper part of the electrode 52, a target 58 for sputtering a lower electrode material such as platinum is fixed, and a lower electrode 59 such as platinum is formed on top of the substrate 54 by means of an rf sputtering method, which is one of the physical vapor deposition methods. At this time, the temperature of the substrate 54 is about 600° C., and the gas pressure inside the reaction chamber 50 is about 1.4 Pa. Next, a dielectric film 60 such as $Ba_{1-x}Sr_xTiO_3$ is formed on the surface of the lower electrode 59 by a plasma chemical vapor deposition method. This film is formed by generating plasma while letting in from the pipe 57 the vapor of the starting material (barium, strontium, organometal compound of titanium), reactive gas (oxygen), and carrier gas (argon). At this time, the temperature of the substrate 54 is about 600° C., and the gas pressure inside the reaction chamber 50 is about 7 Pa. Finally, an upper electrode 61 such as platinum is formed on the surface of the dielectric film 60 under the same conditions as those with the lower electrode 59.

In addition, it is common to perform the physical vapor deposition and the chemical vapor deposition in separate devices.

In the above-mentioned conventional technique, there was a problem when a thin film device was manufactured with a thin film formation apparatus which performed the physical vapor deposition and the chemical vapor deposition in the same chamber. Namely, when a thin film is formed by the physical vapor deposition method after a thin film is formed by the chemical vapor deposition method, it took an extremely long time to clean the inner walls of the chamber or electrodes for increasing the vacuum degree. This was due to the fact that the vapor, which was led in by vaporizing the starting material through heating during the chemical vapor deposition, is cooled, caked again, and remains attached on the inner walls of the chamber or on the electrodes. Another problem was that, when the physical vapor deposition and the chemical vapor deposition are to be performed in separate devices, it was necessary to secure a large area for the installation.

SUMMARY OF THE INVENTION

It is an object of this invention to solve the above-mentioned problems in the conventional system by providing a method and an apparatus of forming thin films, which is small and requires a short thin-film formation time.

In order to accomplish these and other objects and advantages, an apparatus of forming thin films of this invention comprises at least one physical vapor deposition device and at least one chemical vapor deposition device, wherein said physical vapor deposition device and said chemical vapor deposition device are provided with an exhaust pipe respectively for connection with a common exhaust means and an exhaust switching means.

Next, this invention includes a method of forming thin films using a thin film formation apparatus comprising at least one physical vapor deposition device, at least one chemical vapor deposition device, and a common exhaust means, and comprises the steps of connecting the exhaust means via an exhaust switching means and an exhaust pipe to one of said vapor deposition devices, performing a deposition on a substrate surface, connecting the exhaust means via the exhaust switching means and an exhaust pipe to the other vapor deposition device, and further performing a deposition on the substrate surface.

It is preferable that a connection part is disposed at least at one of exhaust pipes which are present between the exhaust switching means and the physical vapor deposition device and between the exhaust switching means and the chemical vapor deposition device.

Furthermore, it is preferable that a substrate transfer passage having at least one switch valve is connected between at least one physical vapor deposition device and at least one chemical vapor deposition device, and a substrate transfer system for forwarding a substrate through the substrate transfer passage is connected to said physical vapor deposition device or said chemical vapor deposition device.

In addition, it is preferable that a thin film is formed on a substrate surface by either said physical vapor deposition device or said chemical vapor deposition device, said both vapor deposition devices are exhausted, said substrate is forwarded to the other vapor deposition device of said two vapor deposition devices through said substrate transfer passage having a switch valve using said substrate transfer system, and a thin film is formed on the substrate surface, thereby forming thin films without exposing the substrate to the air.

It is preferable that the physical vapor deposition device forms a thin film without a chemical reaction by solidifying a gas or ion of a material to be formed into a thin film on a substrate surface.

Furthermore, it is preferable that the physical vapor deposition device comprises one device selected from the group consisting of a vacuum vapor deposition device, an ion plating device, a sputtering device, an ion-containing vapor deposition device, a reactive ion plating device, and a molecular beam epitaxy device.

In addition, it is preferable that the chemical vapor deposition device forms a thin film by providing a gas of a compound comprising composite elements of a material to be formed into a thin film on a substrate surface, and by allowing a chemical reaction to take place inside the gaseous phase or on the substrate surface.

Also, it is preferable that the chemical vapor deposition device comprises one device selected from the group consisting of a thermal CVD (chemical vapor deposition) device, a plasma CVD device, a MOCVD (metalorganic chemical vapor deposition) device, and a plasma MOCVD device.

It is preferable that the physical vapor deposition device comprises at least one device selected from a vacuum vapor deposition device, a sputtering device, and an ion plating device, and that the chemical vapor deposition device comprises either a plasma chemical vapor deposition device or a thermal chemical vapor deposition device.

According to the apparatus of forming thin films of this invention, the apparatus comprises at least one physical vapor deposition device and at least one chemical vapor deposition device, wherein said physical vapor deposition device and said chemical vapor deposition device are provided with an exhaust pipe respectively for connection with a common exhaust means and an exhaust switching means. As a result, an apparatus for forming thin films, which is small and requires a short thin-film formation time, can be attained, together with a method forming thin films. In particular, according to the configuration in which the exhaust switching means is connected to the physical vapor deposition device, to the chemical vapor deposition device, and to an exhaust means via exhaust pipes, this apparatus can be accomplished with a small size, which has at least two chambers and one exhaust means. In this way, thin films can be formed in a short film formation time with a small apparatus, since vapor of a starting material which is led in at the time of chemical vapor deposition does not enter the physical vapor deposition device.

The following effects can be obtained by this invention:

(1) The apparatus of forming thin films is configured such that the exhaust switching means is connected to the physical vapor deposition device, to the chemical vapor deposition device, and to an exhaust means via exhaust pipes, so that vapor of a starting material which is led in at the time of chemical vapor deposition can be prevented from attaching and remaining in the physical vapor deposition device. Thus, the thin-film formation time can be reduced considerably.

(2) The apparatus of forming thin films is configured such that the exhaust switching means is connected to the physical vapor deposition device, to the chemical vapor deposition device, and to an exhaust means via exhaust pipes, and a substrate transfer passage having at least one switch valve is connected between the physical vapor deposition device and the chemical vapor deposition device, and a substrate transfer system for forwarding a substrate through the substrate transfer passage is connected to the physical vapor deposition device or the chemical vapor deposition device, so that the thin-film formation time can be reduced considerably.

(3) According to this invention, a small apparatus of forming thin films which requires a small area for installation can be obtained.

(4) The method of forming thin films using a thin-film formation apparatus, which comprises the exhaust switching means is connected to the physical vapor deposition device, to the chemical vapor deposition device, and to an exhaust means via exhaust pipes, a substrate transfer passage having a switch valve connected between the physical vapor deposition device and the chemical vapor deposition device, and a substrate transfer system for forwarding a substrate through the substrate transfer passage connected to the physical vapor deposition device or the chemical vapor deposition device, comprises the steps of forming a thin film on a substrate surface by either the physical vapor deposition device or the chemical vapor deposition device, exhausting the physical vapor deposition device and the chemical vapor deposition device, forwarding the substrate from the physical vapor deposition device to the chemical vapor deposition device or from the chemical vapor deposition device to the physical vapor deposition device through the substrate transfer passage having a switch valve using the substrate transfer system, and forming a thin film on the substrate surface, thereby forming thin films without exposing the substrate to the air. As a result, the thin film formation time can be reduced considerably, and thin films which have less difference in properties can be formed.

DETAILED DESCRIPTION OF THE INVENTION

This invention will be described in detail by referring to the following examples and attached figures. The examples are illustrative and should not be construed as limiting the invention in any way.

EXAMPLE 1

Figure 1:
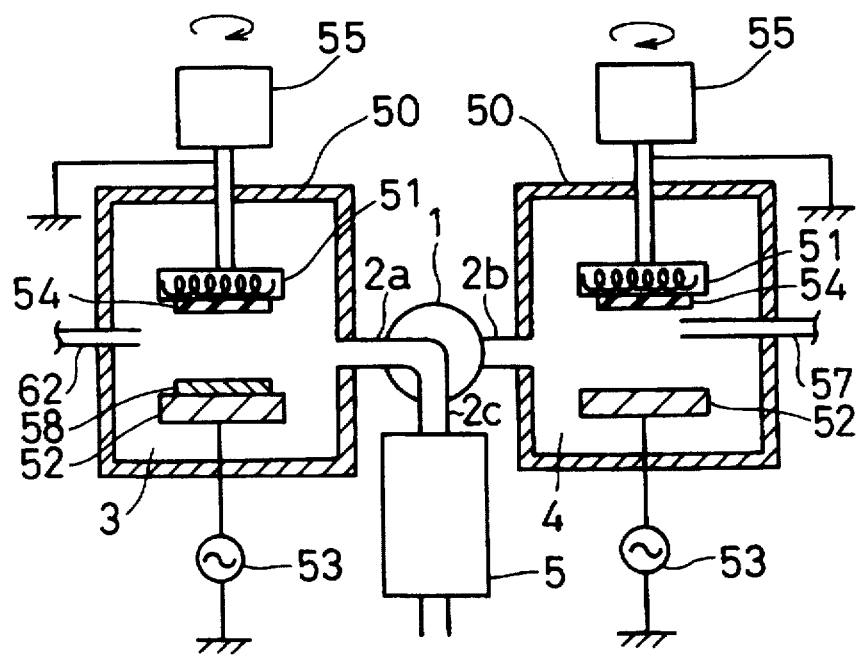
FIG. 1 is a cross-sectional view showing an apparatus of forming thin films in Example 1 of this invention.
Figure 5:
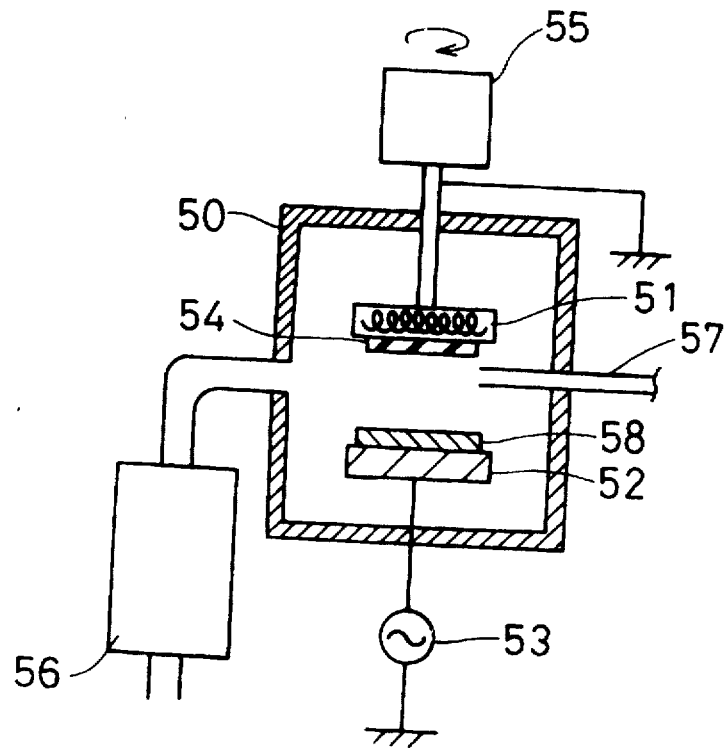
FIG. 5 is a cross-sectional view showing a conventional apparatus of forming thin films.

In FIG. 1, reference numeral 1 represents an exhaust switching means, which is connected to a physical vapor deposition device 3 via an exhaust pipe 2a, to a chemical vapor deposition device 4 via an exhaust pipe 2b, and to an exhaust means 5 via an exhaust pipe 2c. As for the composite elements which have the same function as that in the conventional thin film formation apparatus shown in FIG. 5, they are provided with the same reference numerals.

Figure 6:
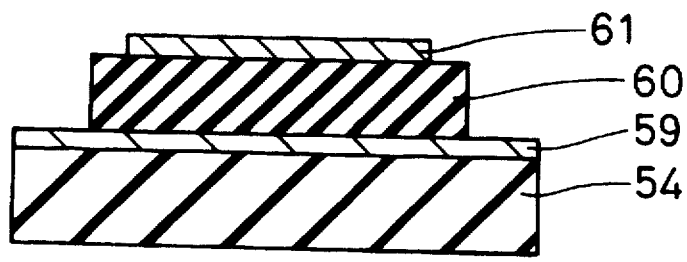
FIG. 6 is a cross-sectional view of a thin film capacitor.

A method of manufacturing thin films capacitor shown in FIG. 6 will be explained by referring to FIG. 1.

First, a silicon substrate 54 was fixed to an electrode integrated with a substrate heater 51 which was disposed in an rf magnetron sputtering device 3 as one physical vapor deposition device. Next, a high-frequency generator 53 was connected to an electrode 52 which has a platinum target 58 fixed on its upper surface. Subsequently, by means of the exhaust switching means 1, the rf magnetron sputtering device 3 and a turbo molecular pump 5 comprising one exhaust means were connected via the exhaust pipes 2a and 2c, and the reactive chamber 50 was exhausted until the gas pressure reached about 0.5 Pa. Then, argon gas as an inactive gas (throughput 2 SCCM) for sputtering was let in through a sputter gas inlet pipe 62, and the silicon substrate 54 was heated at about 600° C. Also, when 50 W of plasma power was applied for 14 minutes by the high-frequency generator 53 (13.56 MHz) while rotating by a substrate rotary system 55, a lower electrode 59 made of platinum was formed with a thickness of about 100 nm. At this moment, the gas pressure inside the reactive chamber 50 was 1.4 Pa.

Next, the silicon substrate 54 formed on the lower electrode 59 of platinum was taken out by breaking the vacuum inside the rf magnetron sputtering device 3, and this silicon substrate 54 was installed to an electrode integrated with a substrate heater 51 inside a plasma chemical vapor deposition device 4 as one chemical vapor deposition device. Subsequently, by means of an exhaust switching means 1, the plasma chemical vapor deposition device 4 and the turbo molecular pump 5 were connected via the exhaust pipes 2b and 2c, and the reactive chamber 50 was exhausted until the gas pressure reached about 3 Pa. Next, for forming a dielectric film 60, each of the vapors which resulted from heating barium dipivaloylmethane {Ba(DPM)$_2$, DPM= $C_5H_7O_2$} (solid at room temperature), strontium dipivaloylmethane {Sr(DPM)$_2$} (solid at room temperature), and tetraisopropoxy titanium {Ti(C$_3$H$_7$O)$_4$} (liquid at room temperature) as the starting material was let into the reactive chamber 50 from a pipe 57 together with argon carrier gas (each throughput is 25, 25, 5 SCCM) and oxygen as a reactive gas (throughput is 10 SCCM). At this moment, the gas pressure inside the reactive chamber 50 was about 7 Pa. Then, the silicon substrate 54 was heated at about 600° C., and when 1.4 W/cm$^2$ of plasma power was applied for 16 minutes by the high-frequency generator 53 while rotating by the substrate rotary system 55, the dielectric thin film 60 made of Ba$_{1-x}$Sr$_x$TiO$_3$ was formed with a thickness of about 2 μm.

Subsequently, the silicon substrate 54 having the dielectric thin film 60 formed on the lower electrode 59 was taken out by breaking the vacuum inside the plasma chemical vapor deposition device 4, and this silicon substrate 54 was once again fixed to the electrode integrated with a substrate heater 51 in the rf magnetron sputtering device 3. In this way, an upper electrode 61 was formed under the same conditions as those when the lower electrode 59 of platinum had been formed. In this instance, since the vapor of the starting material which was led in during the chemical vapor deposition did not enter the rf magnetron sputtering device 3, it was unnecessary to clean the inner walls of the chamber or the electrodes. Therefore, an upper electrode could be formed immediately after the dielectric film was formed. As a result, compared with a conventional thin film formation apparatus which performs the physical vapor deposition and the chemical vapor deposition in the same chamber, thin films could be formed with an extremely short time. Furthermore, this configuration had the advantage of reducing the area needed to install the apparatus, compared with performing the physical vapor deposition and the chemical vapor deposition in separate devices.

EXAMPLE 2

Figure 2:
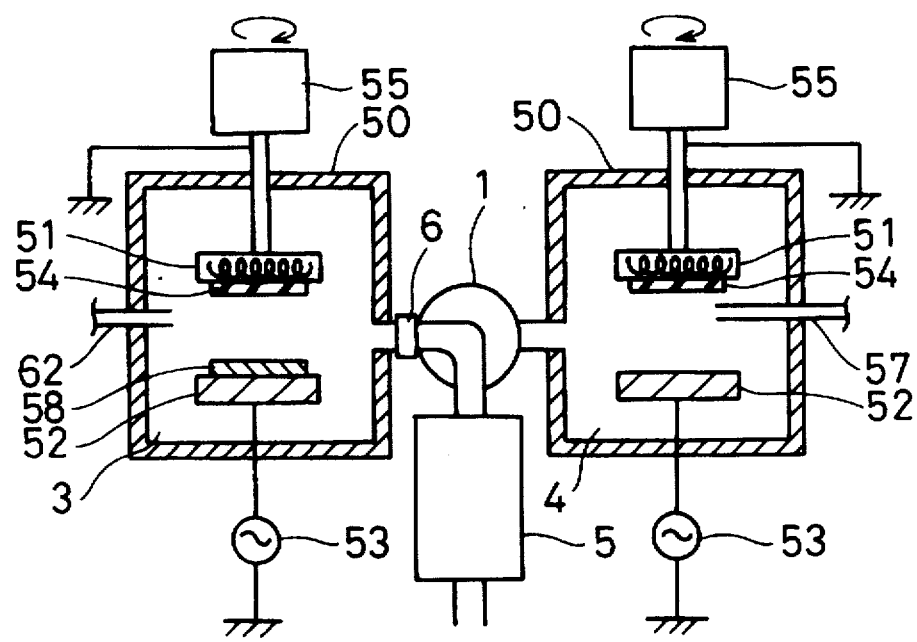
FIG. 2 is a cross-sectional view showing an apparatus of forming thin films in Example 2 of this invention.

Another embodiment of this invention will be explained by referring to FIG. 2.

This embodiment differs from the embodiment of FIG. 1 in that a connection part 6 is disposed at the exhaust pipe 2a between the exhaust switching means 1 and the rf magnetron sputtering device 3.

This configuration has the advantage of separating the rf magnetron sputtering device at the connection part 6 and exchanging it easily with other physical vapor deposition devices.

Furthermore, the connection part 6 may be disposed at the exhaust pipe 2b of between the exhaust switching means 1 and the plasma chemical vapor deposition device 4. Also, the device to be exchanged may be other chemical vapor deposition devices.

EXAMPLE 3

Another embodiment of this invention will be explained by referring to FIG. 3.

This embodiment differs from the embodiment of FIG. 1 in that a substrate transfer passage 8 having a switch valve 7 is connected between the rf magnetron sputtering device 3 and the plasma chemical vapor deposition device 4, and also that a substrate transfer system 9 is connected to the plasma chemical vapor deposition device 4.

Furthermore, this method of forming thin films differs in that thin films can be formed without exposing the substrate to the air. In other words, the switch valve 7 was closed, and the lower electrode 59 was formed inside the rf magnetron sputtering device 3 on the silicon substrate 54 according to the same method as in Example 1, and then, after switching the exhaust switching means 1 to the side of the plasma chemical vapor deposition device 4 and exhausting it. The switch valve 7 was opened, and the silicon substrate 54 was forwarded to the side of the plasma chemical vapor deposition device 4 through the substrate transfer passage 8 by the substrate transfer system 9. Next, the switch valve 7 was closed, and the dielectric thin film 60 of Ba$_{1-x}$Sr$_x$TiO$_3$ was formed on the lower electrode 59 according to the same method as in Example 1 through plasma chemical vapor deposition. After the dielectric thin film 60 was formed, the plasma chemical vapor deposition device 4 was sufficiently exhausted. While keeping the switch valve 7 closed, the exhaust switch means 1 was switched to the side of the rf magnetron sputtering device 3, which was then exhausted. Subsequently, the switch valve 7 was opened, and the silicon substrate 54 was forwarded once again to the side of the rf magnetron sputtering device 3 through the substrate transfer passage 8 by the substrate transfer system 9. Next, the switch valve 7 was closed, and the upper electrode 61 was formed inside the rf magnetron sputtering device 3 on the dielectric thin film 60 of Ba$_{1-x}$Sr$_x$TiO$_3$ with the same method as in Example 1.

According to the above-mentioned confirmation, it is clear that the apparatus of forming thin films in this embodiment can form thin films without exposing the silicon substrate to the air, so that the thin films can be formed with less time than in Example 1. Furthermore, when a substrate disposed with a film is exposed at high temperature to the air by breaking the vacuum, a transformed layer is created at a part of the film surface. As a result, the thin film capacitors manufactured in the above-mentioned manner tend to show difference in properties. However, the apparatus of forming thin films in this embodiment can form thin films without exposing the silicon substrate to the air, thereby enabling reducing of the differences in the properties.

EXAMPLE 4

Figure 4:
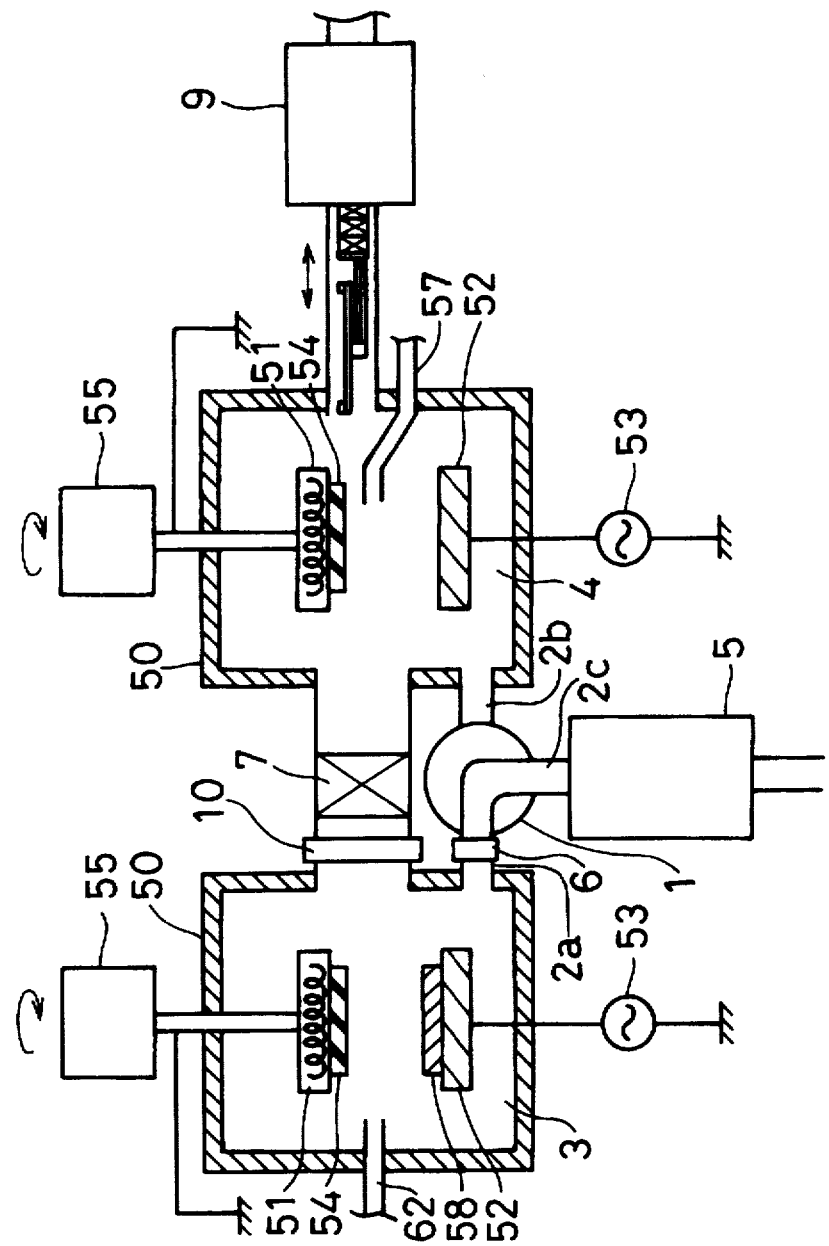
FIG. 4 is a cross-sectional view showing an apparatus of forming thin films in Example 4 of this invention.

Another embodiment of this invention will be explained by referring to FIG. 4.

Figure 3:
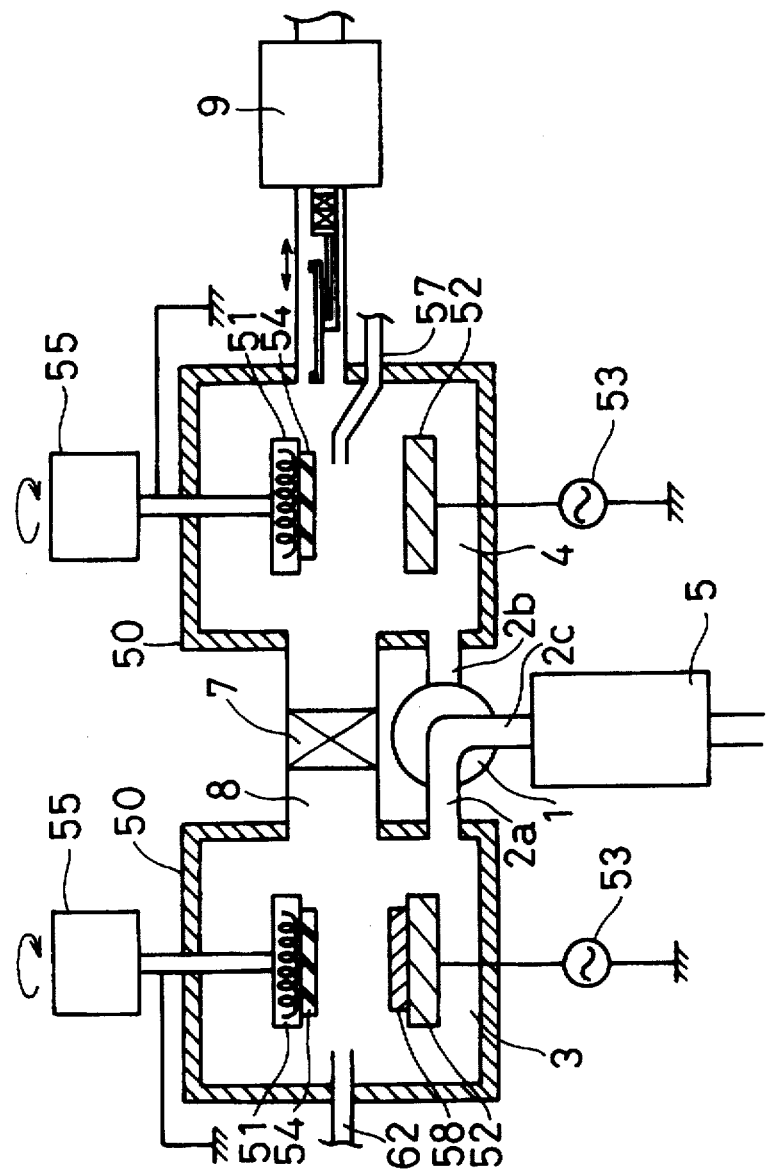
FIG. 3 is a cross-sectional view showing an apparatus of forming thin films in Example 3 of this invention.

This embodiment differs from the embodiment of FIG. 3 in that a connection part 10 is disposed at the substrate transfer passage 8, and a connection part 6 is disposed at an exhaust pipe 2c of between the rf magnetron sputtering device 3 and a turbo molecular pump 5. The substrate transfer passage 8 having the switch valve 7 is connected with the plasma chemical vapor deposition device 4, and the substrate transfer system 9 is connected to the plasma chemical vapor deposition device 4. This configuration has the advantage of cutting off the rf magnetron sputtering device at the connection parts 6 and 10, and exchanging it with other physical vapor deposition devices.

In addition, the connection parts 6 and 10 may be disposed at an exhaust pipe 2b of between the exhaust switching means 1 and the plasma chemical vapor deposition device 4. Furthermore, the device to be exchanged may be other chemical vapor deposition devices.

Also, the embodiments of this invention used the rf sputtering device as the physical vapor deposition device, but the same effects can be obtained by using a vacuum vapor deposition device or an ion plating device. Furthermore, the plasma chemical vapor deposition device was used as the chemical vapor deposition device, but the same effects can be obtained by using a thermochemical vapor deposition device. In addition, the substrate is not limited to the silicon substrate which was used here, but other semiconductor substrates, for example, a conductive substrate such as metal, glass, an insulating substrate such as ceramics, gallium arsenide may be used as well to obtain the same effects. Also, the thin films formed are not limited to the dielectric thin films of platinum and $Ba_{1-x}Sr_xTiO_3$ described here, but other conductive thin films, other dielectric thin films, semiconductor thin films, magnetic thin films, and superconductive thin films may be used to obtain the same effects. Furthermore, it was explained in the above-mentioned embodiments by using one rf sputtering device and one plasma chemical vapor deposition device, but the configuration is not limited to this, and the number can be increased, if necessary. Also, the substrate transfer system may be connected to the physical vapor deposition device instead of the chemical vapor deposition device. In addition, as for the exhaust means, an oil diffusion pump or a dry pump may be used instead of the turbo molecular pump which is one kind of mechanical pump. The switch valve disposed at the substrate transfer passage may be two or more, if necessary.

The invention may be embodied in other forms without departing from the spirit or essential characteristics thereof. The embodiments disclosed in this application are to be considered in all respects as illustrative and not as restrictive. The scope of the invention is indicated by the appended claims rather than by the foregoing description, and all changes which come within the meaning and range of equivalency of the claims are intended to be embraced therein.

What is claimed is:

1. An apparatus for forming thin films on a substrate, comprising:

a sputtering-type physical vapor deposition device comprising a first reaction chamber and a first exhaust outlet communicating with the first reaction chamber;

a plasma metal organic chemical vapor deposition device comprising a second reaction chamber and a second exhaust outlet communicating with the second reaction chamber;

an exhaust means for selectively evacuating either said first reaction chamber through said first exhaust outlet or said second reaction chamber through said second exhaust outlet, each of said first and second exhaust outlets being capable of being in communication with the exhaust means; and an exhaust switch operatively disposed between the exhaust outlets and the exhaust means for selectively putting only one of the first exhaust outlet and the second exhaust outlet in communication with the exhaust means at one time.

2. The apparatus for forming thin films of claim 1, wherein a connection part is provided on at least one of said first and second exhaust outlets, which permits the physical vapor deposition device or the chemical vapor deposition device associated with said at least one of said first and second exhaust outlets to be removed from the apparatus.

3. The apparatus for forming thin films of claim 1, further comprising a substrate transfer passage extending between the physical vapor deposition device and the chemical vapor deposition device, and a substrate transfer system for transferring a substrate from one of the physical vapor deposition device and the chemical deposition device to the other through the substrate transfer passage.

4. The apparatus for forming thin films of claim 3, further comprising a switch valve in the substrate transfer passage.

5. The apparatus for forming thin films of claim 1, wherein the exhaust means comprises a turbo molecular pump.

6. The apparatus for forming thin films of claim 5, wherein the turbo molecular pump is the sole exhaust means for directly exhausting the first and second reaction chambers through the first and second exhaust outlets.

* * * * *